US011381207B2

(12) United States Patent
Biswas

(10) Patent No.: US 11,381,207 B2
(45) Date of Patent: Jul. 5, 2022

(54) APPARATUS AND METHOD FOR AN ANALOG TO DIGITAL CONVERTER

(71) Applicant: STMicroelectronics International N.V., Geneva (CH)

(72) Inventor: Riju Biswas, Noida (IN)

(73) Assignee: STMicroelectronics International N.V., Geneva (CH)

( * ) Notice: Subject to any disclaimer, the term of this patent is extended or adjusted under 35 U.S.C. 154(b) by 100 days.

(21) Appl. No.: 16/838,315

(22) Filed: Apr. 2, 2020

(65) Prior Publication Data

US 2021/0313941 A1 Oct. 7, 2021

(51) Int. Cl.
*H03F 3/45* (2006.01)
*H03M 1/12* (2006.01)

(52) U.S. Cl.
CPC ..... *H03F 3/45188* (2013.01); *H03F 3/45659* (2013.01); *H03M 1/1245* (2013.01); *H03F 2203/45021* (2013.01); *H03F 2203/45074* (2013.01); *H03F 2203/45156* (2013.01); *H03F 2203/45206* (2013.01); *H03F 2203/45214* (2013.01)

(58) Field of Classification Search
CPC ............ H03F 3/45188; H03F 3/45659; H03F 2203/45206; H03F 2203/45021; H03F 2203/45214; H03F 2203/45074; H03F 2203/45156; H03F 3/45475; H03F 1/303; H03F 3/005; H03F 3/45183; H03F 3/45071; H03F 1/34; H03M 1/1245
USPC ............................................. 330/9, 258, 260
See application file for complete search history.

(56) References Cited

U.S. PATENT DOCUMENTS

| | | | |
|---|---|---|---|
| 6,535,030 B1 | 3/2003 | Nix | |
| 7,119,616 B2 * | 10/2006 | Benzer | ................... H03F 3/3022 330/252 |
| 7,420,410 B2 | 9/2008 | Ohba | |
| 7,714,645 B2 | 5/2010 | Lin et al. | |
| 7,746,170 B2 * | 6/2010 | Amini | ................. H03F 3/45179 330/258 |

(Continued)

FOREIGN PATENT DOCUMENTS

CN 104980112 A * 10/2015

OTHER PUBLICATIONS

Toktam Aghee et al., "Gain Boosting of Recycling Folded Cascode OTA Using Positive Feedback and Introducing New Input Path" Analog integrated Circuits and Signal Processing, vol. 90, No. 1, Oct. 14, 2016, pp. 237-246.

(Continued)

*Primary Examiner* — Khanh V Nguyen
(74) *Attorney, Agent, or Firm* — Slater Matsil, LLP

(57) ABSTRACT

An apparatus includes a load pair including a first transistor and a second transistor, a common mode feedback circuit comprising a first common mode feedback transistor and a second common mode feedback transistor, wherein a drain of the first common mode feedback transistor is coupled to a source of the first transistor, and a gate of the first common mode feedback transistor is coupled to a drain of the first transistor, and a drain of the second common mode feedback transistor is coupled to a source of the second transistor, and a gate of the second common mode feedback transistor is coupled to a drain of the second transistor, and an offset cancellation stage coupled to outputs of the load pair.

20 Claims, 7 Drawing Sheets

(56) References Cited

U.S. PATENT DOCUMENTS

| | | | | |
|---|---|---|---|---|
| 7,786,801 | B2* | 8/2010 | Kim | H03F 3/45219 330/255 |
| 8,704,597 | B2* | 4/2014 | Yu | H03F 3/193 330/253 |
| 9,379,672 | B2* | 6/2016 | Ciubotaru | H03F 1/26 |
| 9,473,163 | B1 | 10/2016 | Tsai | |
| 9,571,052 | B1 | 2/2017 | Trampitsch | |
| 9,660,585 | B2* | 5/2017 | Mittal | H03F 3/211 |
| 10,797,662 | B2* | 10/2020 | Joo | H03F 3/45179 |
| 10,819,295 | B2* | 10/2020 | Yasuda | H03F 3/45237 |
| 2010/0301938 | A1* | 12/2010 | Nakao | H03F 3/45183 330/253 |
| 2011/0018633 | A1* | 1/2011 | Hsieh | H03F 3/50 330/253 |
| 2013/0265106 | A1* | 10/2013 | Misawa | H03F 1/223 327/557 |
| 2018/0342994 | A1* | 11/2018 | Zamprogno | H03F 1/0205 |

OTHER PUBLICATIONS

M. Pilar Garde et al., "Super Class-AB Recycling Folded Cascode OTA" IEEE Journal of Solid-State Circuits, vol. 53, No. 9, Sep. 2018, pp. 2614-2623.

Harikrishna Veldano et al., "An Ultra-Low-Voltage Bulk-Driven Analog Voltage Buffer with Rail-to-Rail Input/Output Range" Circuits, Systems and Signal Processing, vol. 36, No. 12, Sep. 18, 2017, pp. 4886-4907.

Ghader Yosefi, "The High Recycling Folded Cascode (HRFC): A General Enhancement of the Recycling Folded Cascode Operational Amplifier" Microelectronics Journal, vol. 89, Jul. 2019, pp. 70-90.

Xiao Zhao et al., "A Transconductance Enhanced Recycling Structure for Folded Cascode Amplifier" Analog Integrated Circuits and Signal Processing, vol. 72, No. 1, Feb. 19, 2012, pp. 259-263.

Masashi Kijima et al., "A 6b 3GS/s Flash ADC with Background Calibration," IEEE 2009 Custom Intergrated Circuits Conference (CICC), XP031542708, Sep. 13, 2009, pp. 283-286.

\* cited by examiner

APPARATUS AND METHOD FOR AN ANALOG TO DIGITAL CONVERTER

TECHNICAL FIELD

The present invention relates generally to a preamplifier in a successive approximation analog-to-digital converter.

BACKGROUND

Analog-to-digital (A/D) converters are commonly used in digital electronics systems to convert analog signals into digital signals. The digital signals may be further processed by various digital processors such as digital audio processors, digital video processors, wireless communication processors and the like. In some applications, A/D converters may be implemented as standalone semiconductor devices. Alternatively, A/D converters may be integrated with other circuitry on a single integrated circuit. While various A/D architectures may be used today, the successive approximation A/D converter is widely used in a variety of applications requiring medium conversion speed and resolution.

The successive approximation A/D converter converts an input analog signal to a digital signal by comparing various output values of a digital-to-analog (D/A) converter with the input analog signal over a number of clock cycles. For example, in a first conversion cycle, the most significant bit (MSB) of the digital signal is determined by comparing the input analog signal with the midscale output of the D/A converter (that is, an analog output corresponding to 100 . . . 00, where the MSB of the D/A converter input is set to 1). If the value of the input analog signal is greater than the midscale output of the D/A converter, the MSB of the digital signal is set to a logical one. On the other hand, if the value of the input analog signal is less than the midscale output of the D/A converter, the MSB of the digital signal is set to a logical zero. In the second conversion cycle, the input analog signal is compared with the ¼ scale or ¾ scale output of the D/A converter depending on the outcome of the first conversion cycle. In the second conversion cycle, the second most significant bit is determined. The comparison method described above continues all the way down to the least significant bit (LSB) of the digital signal. Once the LSB has been determined, the A/D conversion is complete and the digital signal is available at a register of the A/D converter.

SUMMARY

In accordance with an embodiment, an amplifier comprises a load pair including a first transistor and a second transistor, a common mode feedback circuit comprising a first common mode feedback transistor and a second common mode feedback transistor, wherein a drain of the first common mode feedback transistor is coupled to a source of the first transistor, and a gate of the first common mode feedback transistor is coupled to a drain of the first transistor, and a drain of the second common mode feedback transistor is coupled to a source of the second transistor, and a gate of the second common mode feedback transistor is coupled to a drain of the second transistor, and a cross-coupled transistor pair configured to boost a gain of the amplifier.

In accordance with another embodiment, a method comprises configuring an amplifier to operate in an offset cancellation phase to generate a first offset voltage at a first output of the amplifier and a second offset voltage at a second output of the amplifier, and store the first offset voltage and the second offset voltage at a first storage element and a second storage element respectively, wherein the first storage element is coupled to the first output of the amplifier through a first auxiliary switch, and the second storage element is coupled to the second output of the amplifier through a second auxiliary switch, configuring the amplifier to operate in a reset phase through turning on a first reset switch coupled between the first output and the second output of the amplifier, and configuring the amplifier to operate in an amplification phase, wherein in the amplification phase, a first offset-cancellation voltage and a second offset-cancellation voltage are fed into the first output and the second output of the amplifier, respectively.

In accordance with yet another embodiment, an apparatus comprises a load pair including a first transistor and a second transistor, a common mode feedback circuit comprising a first common mode feedback transistor and a second common mode feedback transistor, wherein a drain of the first common mode feedback transistor is coupled to a source of the first transistor, and a gate of the first common mode feedback transistor is coupled to a drain of the first transistor, and a drain of the second common mode feedback transistor is coupled to a source of the second transistor, and a gate of the second common mode feedback transistor is coupled to a drain of the second transistor, and an offset cancellation stage coupled to outputs of the load pair.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

The present disclosure will be described with respect to preferred embodiments in a specific context, namely a preamplifier in a successive approximation analog-to-digital (A/D) converter. The present disclosure may also be applied, however, to a variety of systems and applications that convert an analog signal into a digital signal. Hereinafter, various embodiments will be explained in detail with reference to the accompanying drawings.

Figure 1:
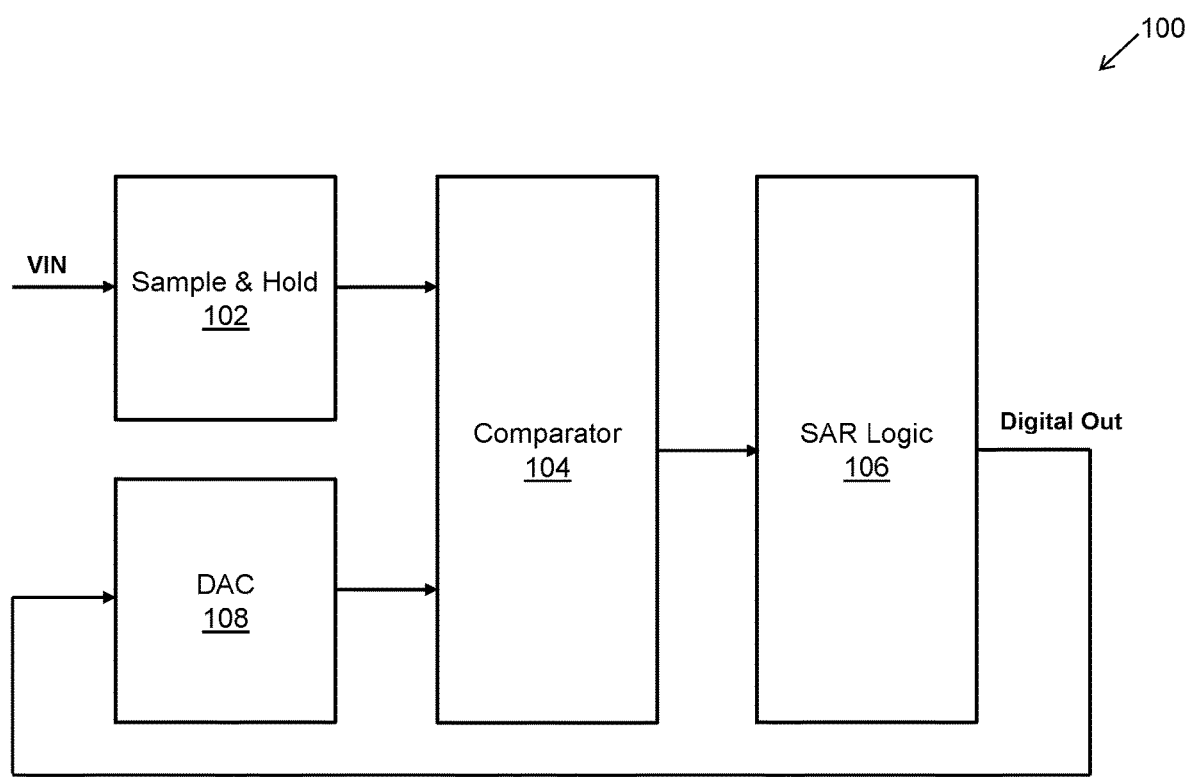
FIG. 1 illustrates a block diagram of a successive approximation A/D converter in accordance with various embodiments of the present disclosure.

FIG. 1 illustrates a block diagram of a successive approximation A/D converter in accordance with various embodiments of the present disclosure. The successive approximation A/D converter 100 comprises a sample and hold block 102, a comparator 104, a successive approximation logic block 106 and a digital-to-analog (D/A) converter 108. In some embodiments, the successive approximation A/D converter 100 may be implemented as a 12-bit A/D converter. It should be appreciated that the 12-bit A/D converter described above is merely an example. A person skilled in the art would recognize there may be many alternatives.

As shown in FIG. 1, the sample and hold block 102 is configured to receive an input signal VIN. VIN is an analog signal. The sample and hold block 102 may be configured to operate in either a sampling phase or a conversion phase. In the sampling phase, an internal switch is turned on. The input signal VIN may be sampled and stored at a holding circuit. In some embodiments, the sampled voltage may be stored on a capacitor, a capacitor network and the like. Storing the sampled voltage on a capacitive element is merely an example. Depending on different applications and design needs, different architectures may be alternatively used. In the conversion phase, the internal switch may be turned off to hold the sampled voltage on the capacitor. This sampled voltage can then be provided to the comparator 104. Through a successive comparison process, the A/D converter 100 generates a digital output corresponding to the input signal VIN.

As shown in FIG. 1, the output of the sample and hold block 102 is fed into a first input of the comparator 104. A second input of the comparator 104 is configured to receive an output signal generated by the D/A converter 108. The D/A converter 108 is employed to convert a digital output signal generated by the successive approximation logic block 106 into a corresponding analog signal, which is compared with the output signal of the sample and hold block 102 at the comparator 104. The comparison result generated by the comparator 104 is fed into the successive approximation logic block 106. Based on the comparison result, the successive approximation logic block 106 generates a digital output signal corresponding to the input signal VIN.

In operation, the successive approximation A/D converter 100 determines the value of each bit of the digital output signal in a sequential manner based on the output of the comparator 104. The successive approximation A/D converter 100 starts the conversion phase by temporally setting the most significant bit (MSB) of a digital word equal to 1, and all the other bits equal to 0. This digital word is applied to the D/A converter 108 in which an analog signal is generated based on the digital word. This analog signal is compared to the input signal VIN. If the comparator output is high, the successive approximation logic block 106 sets the MSB of the digital word equal to 1. On the other hand, if the comparator output is low, the successive approximation logic block 106 sets the MSB of the digital word equal to 0. After this comparison, the value of the MSB of the digital word has been determined. The approximation process continues. In the next cycle, the second bit is temporally set to 1 and the remaining undetermined bits are set to 0. Once again, the output from the D/A converter 108 is compared to the input signal VIN. If the comparator output is high, the second bit is set to 1, otherwise to 0. After this comparison, the value of the second bit has been determined. The approximation process continues until the least significant bit (LSB) of the digital word has been determined. The content of the digital word after the LSB has been determined represents the digital output of the successive approximation A/D converter 100.

In some embodiments, the comparator 104 may comprise a preamplifier and a latch. In operation, the preamplifier may introduce unwanted offset to the comparator 104. In the present disclosure, a high gain preamplifier is employed to reduce the offset. Furthermore, an offset cancellation circuit may be used to further reduce the offset of the comparator 104. The detailed structure and operating principle of the preamplifier will be described below with respect to FIGS. 2-7.

Figure 2:
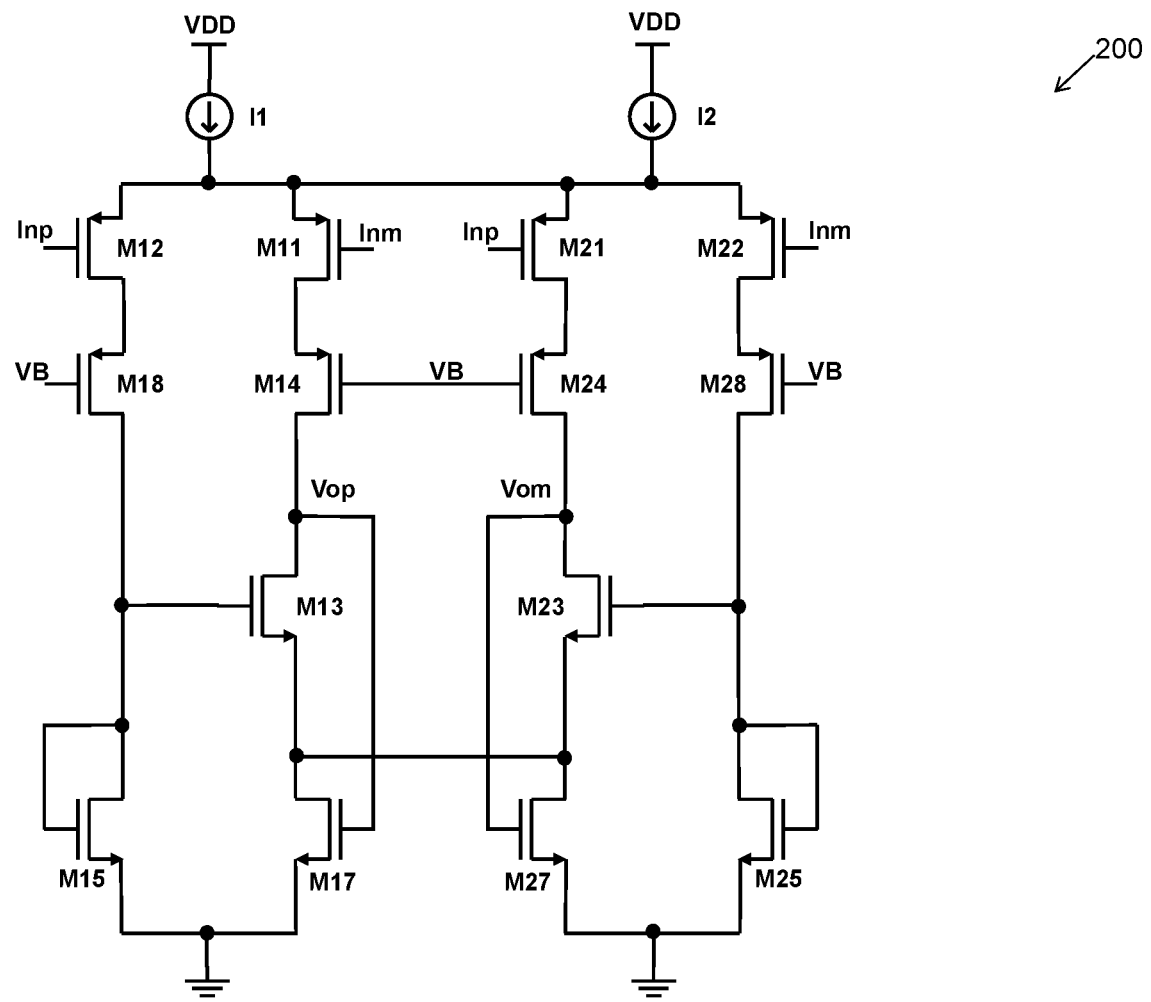
FIG. 2 illustrates a schematic diagram of a first implementation of the preamplifier of the comparator shown in FIG. 1 in accordance with various embodiments of the present disclosure.

FIG. 2 illustrates a schematic diagram of a first implementation of the preamplifier of the comparator shown in FIG. 1 in accordance with various embodiments of the present disclosure. The preamplifier 200 is powered by a supply voltage VDD. In some embodiments, the supply voltage is in a range from about 1.6 V to about 5 V. In some embodiments, the supply voltage VDD is regulated at 3.3 V. According to different applications and design needs, other regulated voltages may be used. A first current source I1 and a second current source I2 are employed to provide a bias current for the preamplifier 200. In some embodiments, the current level of the first current source I1 is equal to the current level of the second current source I2. In other words, each current source provides one half of the bias current of the preamplifier 200.

The preamplifier 200 includes a load pair. As shown in FIG. 2, the load pair is formed by transistor M13 and M23. Both M13 and M23 are implemented as n-type transistors. The preamplifier 200 includes input differential pairs. A first input differential pair comprises M11 and M12. A second input differential pair comprises M21 and M22. The gates of the transistors M12 and M21 are configured to receive a first input signal Inp. The drain of the transistor M13 is configured to generate a first output signal Vop of the preamplifier 200. Likewise, the gates of the transistors M11 and M22 are configured to receive a second input signal Inm. The drain of the transistor M23 is configured to generate a second output signal Vom of the preamplifier 200.

The preamplifier 200 further comprises a common mode feedback circuit comprising a first common mode feedback transistor M17 and a second common mode feedback transistor M27. Both the first common mode feedback transistor M17 and the second common mode feedback transistor M27 are implemented as n-type transistors. As shown in FIG. 2, the drain of the first common mode feedback transistor M17 is coupled to a source of the transistor M13. The gate of the first common mode feedback transistor M17 is coupled to the first output of the preamplifier 200. The source of the first common mode feedback transistor M17 is coupled to ground. Likewise, the drain of the second common mode feedback transistor M27 is coupled to the source of the transistor M23. The gate of the second common mode feedback transistor M27 is coupled to the second output of the preamplifier 200. The source of the second common mode feedback transistor M27 is coupled to ground. The drain of the first common mode feedback transistor M17 is directly coupled to the drain of the second common mode feedback transistor M27.

It should be noted that the outputs of the preamplifier 200 are high-impedance outputs. Without having the common mode feedback circuit shown in FIG. 2, the output voltages of the preamplifier 200 may not be precisely controlled. In DC analysis of the preamplifier 200, the common mode feedback circuit shown in FIG. 2 helps to control the output voltages of the preamplifier 200. In AC analysis, the direct connection between the drain of M17 and the drain of M27 form a short circuit path. The AC current can only pass through M13 and M23. The short circuit path prevents the AC current from entering transistors M17 and M27. As such, the transistors M17 and M27 have no impact on the AC gain of the preamplifier 200.

As shown in FIG. 2, the preamplifier 200 further comprises a first diode-connected load M15 and a second diode-connected load 25. Both M15 and M25 are implemented as n-type transistors. The gate of M15 is coupled to the drain of M15 and further coupled to the gate of M13. The source of M15 is coupled to ground. The gate of M25 is coupled to the drain of M25 and further coupled to the gate of M23. The source of M25 is coupled to ground. It should be noted that the diode-connected load (e.g., M15) is merely an example. There may be many alternatives, modifications and variations. For example, the diode-connected load may be replaced by a resistor.

The preamplifier 200 further comprises cascode transistors M14, M18, M24 and M28. As shown in FIG. 2, transistors M12 and M18 are coupled in series. The gate of the transistor M12 is configured to receive Inp. The gate of the transistor M18 is coupled to a bias voltage VB. The drain of the transistor M18 is coupled to the gate of the transistor M13.

As shown in FIG. 2, transistors M22 and M28 are coupled in series. The gate of the transistor M22 is configured to receive Inm. The gate of the transistor M28 is coupled to the bias voltage VB. The drain of the transistor M28 is coupled to the gate of the second transistor M23. As shown in FIG. 2, transistors M12, M18, M22 and M28 are implemented as p-type transistors.

As shown in FIG. 2, the source of the transistor M11 is coupled to the source of the transistor M21. The gate of the transistor M11 is configured to receive the second input signal Inm. The gate of the transistor M21 is configured to receive the first input signal Inp. The drain of the transistor M11 is coupled to the source of the transistor M14. The drain of the transistor M21 is coupled to the source of the transistor M24. The gate of the transistor M14 and the gate of the transistor M24 are coupled together and further coupled to the bias voltage VB. In some embodiments, the bias voltage VB is equal to the sum of the output voltage (e.g., Vop) and the threshold voltage of M14. The drain of the transistor M14 is coupled to the drain of the transistor M13. The drain of the transistor M24 is coupled to the drain of the transistor M23. As shown in FIG. 2, the transistors M11, M14, M21 and M24 are implemented as p-type transistors.

Transistor M18, M14, M24 and M28 are cascode transistors. Transistors M11, M12, M21 and M22 form two differential input pairs. The cascode transistors are employed to protect the differential input pairs.

In some embodiments, the transconductance of the transistor M11 is equal to the transconductance of the transistor M21. The transconductance of M11 and M21 is defined as $g_{m1}$. The transconductance of the transistor M12 is equal to the transconductance of the transistor M22. The transconductance of M12 and M22 is defined as $g_{m2}$. In some embodiments, $g_{m2}$ is greater than $g_{m1}$.

In some embodiments, the transconductance of the transistor M13 is equal to the transconductance of the transistor M23. The transconductance of M13 and M23 is defined as $g_{mn3}$. The transconductance of the transistor M17 is equal to the transconductance of the transistor M27. The transconductance of M17 and M27 is defined as $g_{mn2}$. The transconductance of the transistor M15 is equal to the transconductance of the transistor M25. The transconductance of M15 and M25 is defined as $g_{mn1}$.

The effective input transconductance ($g_{m\_effective}$) of the preamplifier 200 can be expressed by the following equation:

$$g_{m\_effective} = 0.5 \times (g_{m1} + g_{m2} \times g_{mn3} \times R) \quad (1)$$

where R is equal to $1/g_{mn1}$. R can be made by various ways. R can be varied to change the gain of the preamplifier 200. For example, negative resistance loads may be used to change the value of R. The negative resistance loads will be described below with respect to FIG. 3.

As indicated by Equation (1), the effective input transconductance of the preamplifier 200 has been increased. This increased input transconductance helps to reduce the offset and noise of the preamplifier 200.

The input transconductance of a conventional preamplifier may be defined as $g_{mn11}$. The transconductance boosting factor of the preamplifier 200 can be expressed as:

$$Gm \text{ Boosting Factor} = 0.5 \times \left( \frac{g_{m1}}{g_{m11}} + \frac{g_{m2} \times g_{mn3} \times R}{g_{m11}} \right) \quad (2)$$

The DC gain of the preamplifier 200 can be expressed by the following equation:

$$DC \text{ Gain} = \frac{0.5}{g_{ds1}} \times (g_{m1} + g_{m2} \times g_{mn3} \times R) \quad (3)$$

where $g_{ds1}$ is the effective output admittance of the preamplifier 200.

The 3 dB bandwidth of the preamplifier 200 can be expressed as:

$$3\ dB\ BW = \frac{g_{ds\_load}}{2 \times \pi \times C_{load}} \quad (4)$$

where $g_{ds\_load}$ is the output admittance of the transistors M13 and M23, and $C_{load}$ is a capacitance at the outputs of the preamplifier 200.

The unity-gain bandwidth (UGB) of the preamplifier 200 can be expressed by the following equation:

$$UGB = \frac{g_{m\_effective}}{2 \times \pi \times C_{load}} \quad (5)$$

The input referred noise of the preamplifier 200 can be expressed by the following equation:

$$Input\_Referred\_Noise = \frac{1}{g_{m\_effective}} \times \left(\frac{1}{g_{m\_effective}} + \frac{g_{mload}}{g_{m\_effective}}\right) \quad (6)$$

where $g_{mload}$ is the transconductance of the transistors M13 and M23.

The input referred offset of the preamplifier 200 can be expressed by the following equation:

$$Input\_Referred\_Offset = V_{offsetinput} + V_{offsetload} \times \frac{g_{mload}}{g_{m\_effective}} \quad (7)$$

where $V_{offsetinput}$ is the offset voltage due to the mismatches among the input pairs (e.g., M11/M12), and $V_{offsetload}$ is the offset voltage due to the mismatches among the load pairs (e.g., M13/M23).

As indicated by Equations (6) and (7), both the offset and noise of the preamplifier 200 have been reduced after boosting the input transconductance of the preamplifier 200. One advantageous feature of the preamplifier 200 is the power consumption of the preamplifier 200 is similar to that of the conventional amplifier. In addition, the preamplifier 200 shown in FIG. 2 has a simple bias circuit. As a result of having this simple bias circuit, the layout area may be reduced.

In a conventional preamplifier, about one half of the bias current flows through one transistor of a load pair. In contrast, only about one quarter of the bias current flows through one transistor of the load pair (M13/M23) shown in FIG. 2. Such a reduced bias current flowing through the load pair (M13/M23) helps to improve the output impedance of M13/M23, and lower the transconductance of the load pair (M13/M23). The improved output impedance and the reduced transconductance of M13/M23 help to lower the offset and noise contribution from the load pair.

Figure 3:
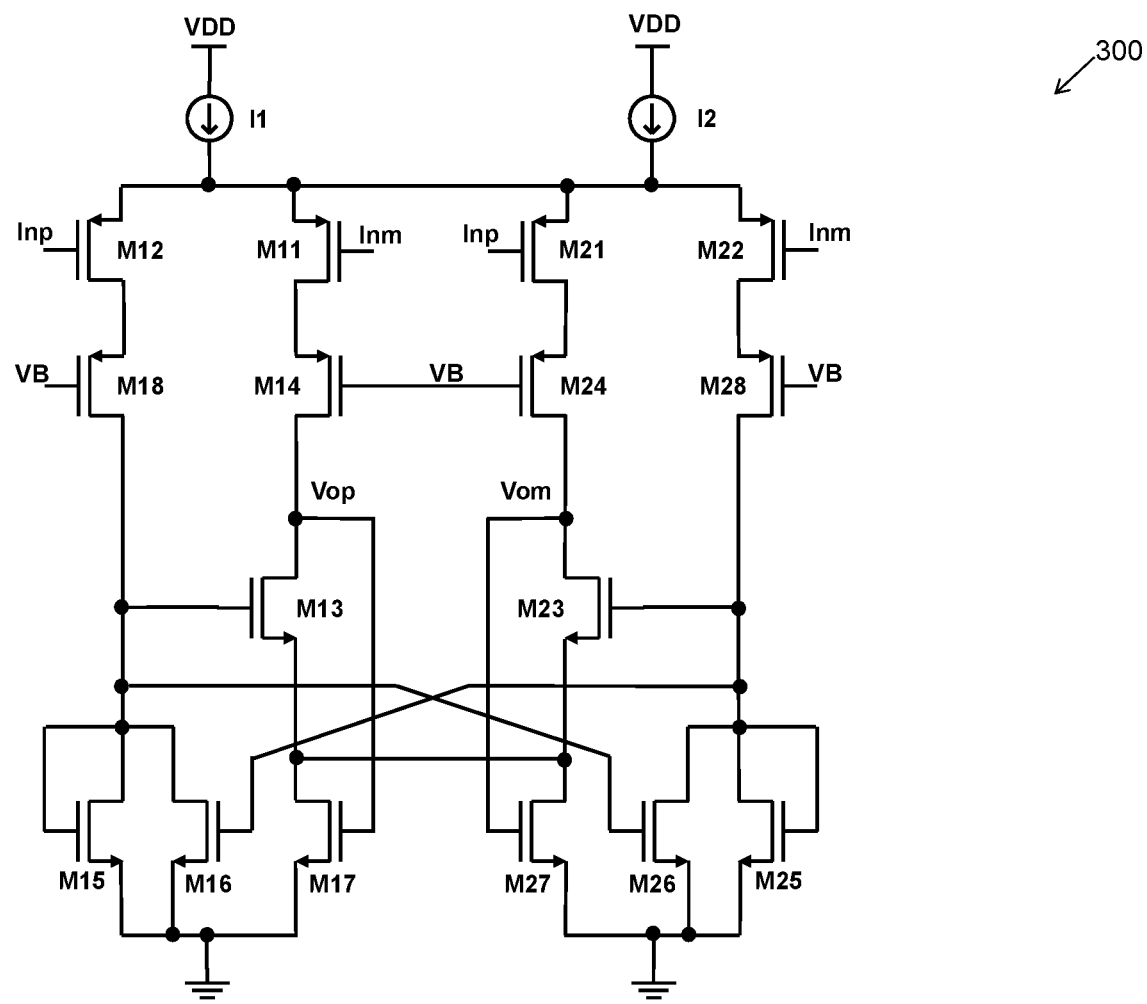
FIG. 3 illustrates a schematic diagram of a second implementation of the preamplifier of the comparator shown in FIG. 1 in accordance with various embodiments of the present disclosure.

FIG. 3 illustrates a schematic diagram of a second implementation of the preamplifier of the comparator shown in FIG. 1 in accordance with various embodiments of the present disclosure. The preamplifier 300 shown in FIG. 3 is similar to the preamplifier 200 shown in FIG. 2 except that the preamplifier 300 further comprises a first negative resistance load and a second negative resistance load coupled to the gate of the transistor M13 and the gate of the transistor M23 respectively.

As shown in FIG. 3, the first negative resistance load and the second negative resistance load are formed by a cross-coupled transistor pair comprising a first auxiliary transistor M16 and a second auxiliary transistor M26. The first auxiliary transistor M16 and the second auxiliary transistor M26 are implemented as n-type transistors. As shown in FIG. 3, the first auxiliary transistor M16 has a gate coupled to the gate of the transistor M23, and a drain coupled to the gate of the transistor M13. The second auxiliary transistor M26 has a gate coupled to the gate of the transistor M13, and a drain coupled to the gate of the transistor 23.

As shown in FIG. 3, the first diode-connected load M15 and the first auxiliary transistor M16 of the cross-coupled transistor pair are coupled in parallel. Likewise, the second diode-connected load M25 and the second auxiliary transistor M26 of the cross-coupled transistor pair are coupled in parallel. The negative resistance loads are employed to change the resistance between the gate of M13 and ground.

The resistance between the gate of M13 and ground can be expressed by the following equation:

$$R = \frac{1}{g_{mn1} - g_{mn2}} \quad (8)$$

where $g_{mn1}$ is the transconductance of M15, and $g_{mn2}$ is the transconductance of M16.

As indicated by Equation (8), the resistance between the gate of M13 and ground has been increased after the first negative resistance load is coupled in parallel with the first diode-connected load M15. As indicated by Equations (1)-(3) above, the increased resistance helps to increase the gain of the preamplifier, thereby reducing the offset and noise of the preamplifier. The resistance between the gate of M23 and ground is similar to that of M13, and hence is not discussed herein.

Figure 4:
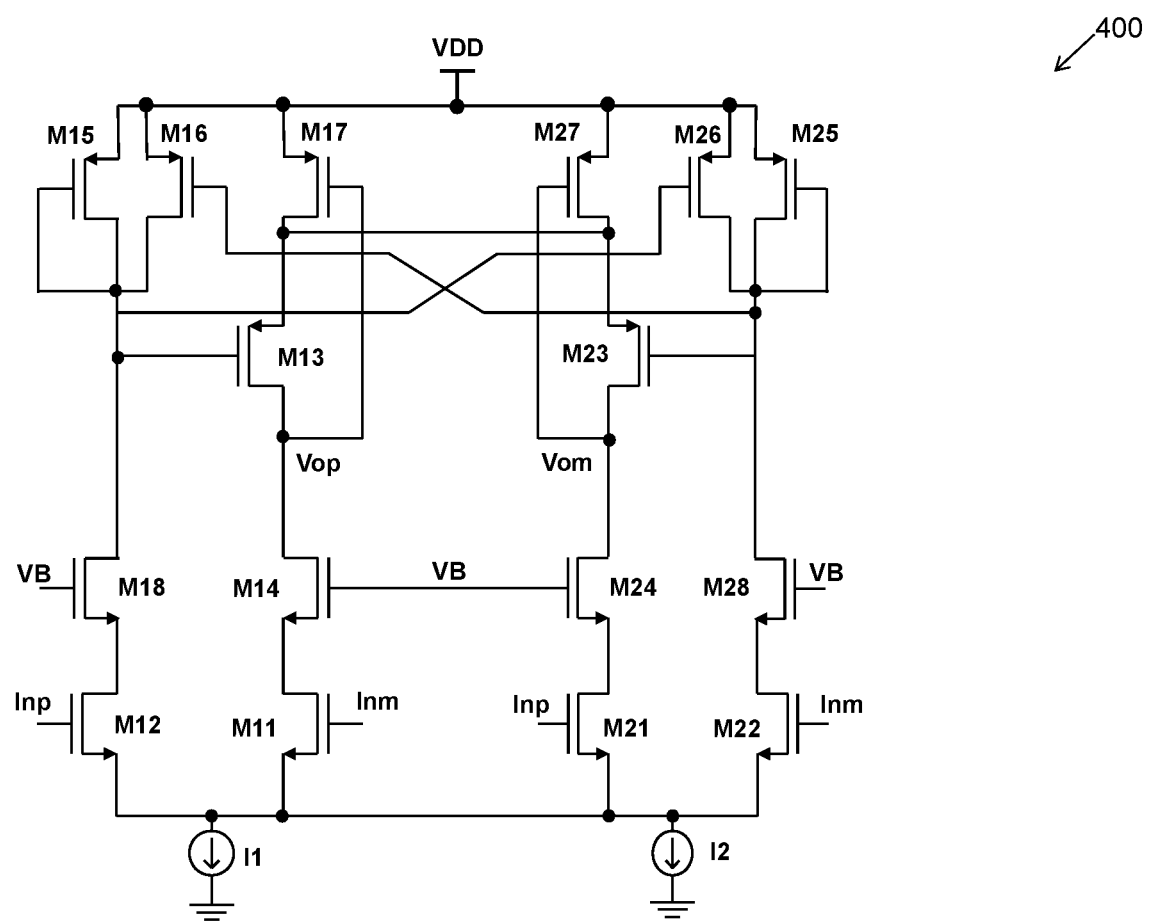
FIG. 4 illustrates a schematic diagram of a third implementation of the preamplifier of the comparator shown in FIG. 1 in accordance with various embodiments of the present disclosure.

FIG. 4 illustrates a schematic diagram of a third implementation of the preamplifier of the comparator shown in FIG. 1 in accordance with various embodiments of the present disclosure. The preamplifier 400 shown in FIG. 4 is similar to the preamplifier 300 shown in FIG. 3 except that the polarity of the various transistors can be changed from n-type to p-type or from p-type to n-type.

As shown in FIG. 4, the input stages are formed by n-type transistors M11, M12, M21 and M22. The cascode transistor stages are formed by n-type transistors M14, M18, M24 and M28. The transistors M13 and M23 are implemented as p-type transistors. The diode-connected loads and the negative resistance loads are formed by p-type transistors M15, M16, M17, M25, M26 and M27. The operating principle of the preamplifier 400 is similar to that of the preamplifier 300 shown in FIG. 3, and hence is not discussed herein again to avoid repetition.

It should be noted that the transistors in the embodiments above and in the following discussion can be replaced by any suitable transistors such as bipolar transistors or any other types of field effect transistors. The transistors shown in the various embodiments of the present disclosure are merely examples. The types and the polarity of the transistors are chosen for the purpose of clearly illustrating the inventive aspects of the various embodiments and are not intended to limit the various embodiments of the present disclosure to any particular type and polarity of the transistors.

Figure 5:
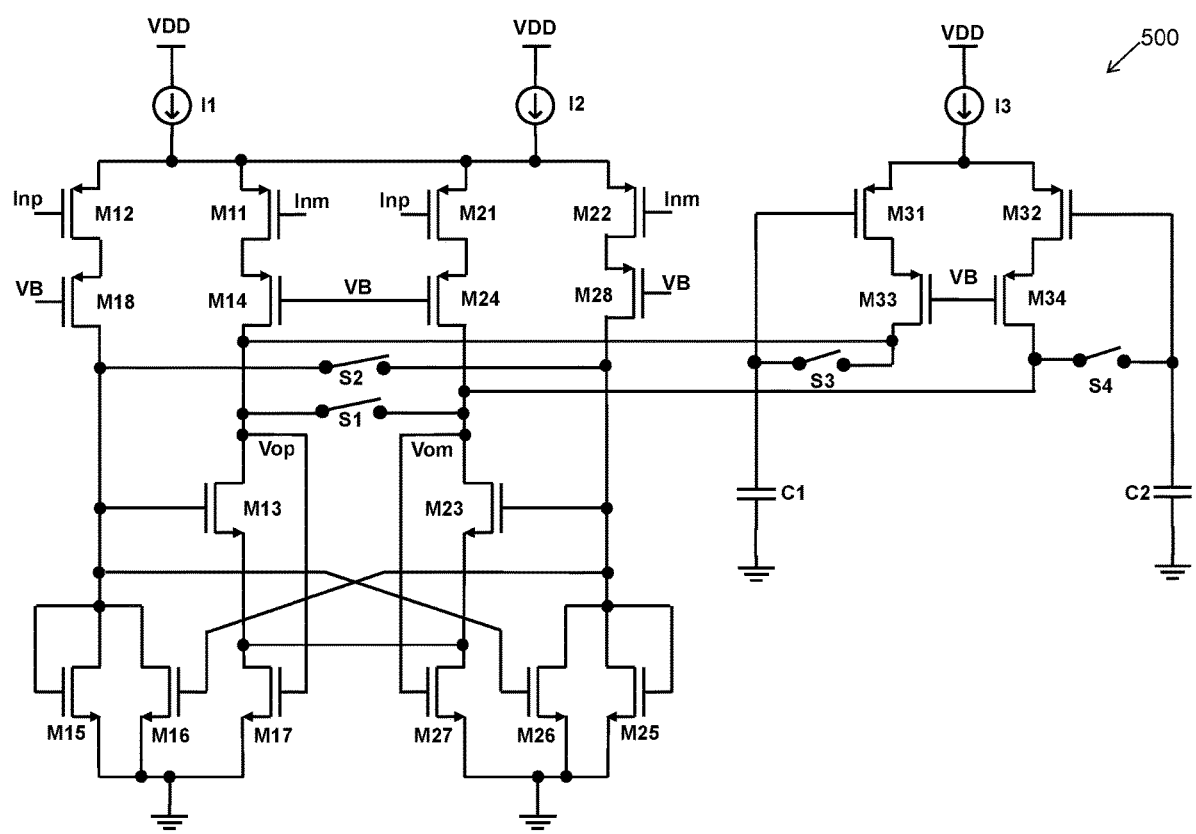
FIG. 5 illustrates a schematic diagram of a fourth implementation of the preamplifier of the comparator shown in FIG. 1 in accordance with various embodiments of the present disclosure.

FIG. 5 illustrates a schematic diagram of a fourth implementation of the preamplifier of the comparator shown in FIG. 1 in accordance with various embodiments of the present disclosure. The preamplifier 500 shown in FIG. 5 is similar to the preamplifier 300 shown in FIG. 3 except that an offset cancellation stage and the associated switches have been added to further improve the performance of the preamplifier 500.

The offset cancellation stage comprises transistors M31, M32, M33 and M34. Transistors M31, M32, M33 and M34 are implemented as p-type transistors. The offset cancellation stage further comprises a first storage element and a second storage element. In some embodiments, the first storage element is implemented as a first capacitor C1. The second storage element is implemented as a second capacitor C2.

The offset cancellation stage is an auxiliary amplifier. A third current source I3 is employed to provide a bias current for this auxiliary amplifier. In some embodiments, the current flowing through the first current source I1 is set to one half of a predetermined current. The current flowing through the second current source I2 is set to one half of the predetermined current. The current flowing through the second current source I3 is predetermined based on different applications and design needs.

As shown in FIG. 5, the transistors M31 and M33 are coupled in series. The transistors M32 and M34 are coupled in series. The source of the transistor M31 and the source of the transistor M32 are coupled together and further coupled to the third current source I3. The gate of the transistor M31 is coupled to the first capacitor C1. The drain of the transistor M31 is coupled to the source of the transistor M33. The gate of the transistor M32 is coupled to the second capacitor C2. The drain of the transistor M32 is coupled to the source of the transistor M34. The gate of the transistor M33 and the gate of the transistor M34 are coupled together and further coupled to the bias voltage VB. The drain of the transistor M33 is coupled to the first output Vop of the preamplifier 500. The drain of the transistor M34 is coupled to the second output Vom of the preamplifier 500.

The preamplifier 500 further comprises two reset switches, namely S1 and S2, and two auxiliary switches, namely S3 and S4. As shown in FIG. 5, the first reset switch S1 is coupled between the drain of the transistor M13 and the drain of the transistor M14. The second reset switch S2 is coupled between the gate of the transistor M13 and the gate of the transistor M14. The first auxiliary switch S3 is coupled between the drain of the transistor M33 and the first capacitor C1. The second auxiliary switch S4 is coupled between the drain of the transistor M34 and the second capacitor C2.

In operation, the first reset switch S1 and the second reset switch S2 are configured to be turned on when the preamplifier 500 is configured to operate in a reset phase. The first reset switch S1 and the second reset switch S2 are configured to be turned off when the preamplifier 500 is configured to operate in an amplification phase. The first auxiliary switch S3 and the second auxiliary switch S4 are configured to be turned on when the preamplifier 500 is configured to operate in an offset cancellation phase. The first auxiliary switch S3 and the second auxiliary switch S4 are configured to be turned off when the preamplifier 500 is configured to operate in the amplification phase. The detailed description of the reset phase, the amplification phase and the offset cancellation phase will be discussed below with respect to FIG. 6.

It should be noted that the cascode pairs (e.g., M14/M18, M24/M28 and M33/M34) of FIG. 5 help to protect the gates of the input pairs (e.g., M11/M12, M21/M22 and M31/M32) from being impacted by the kick-back noise generated by the reset switches S1, S2 and the auxiliary switches S3, S4. In addition, the cascode pairs also reduce the effective input capacitance of the input of preamplifier 500.

Figure 6:
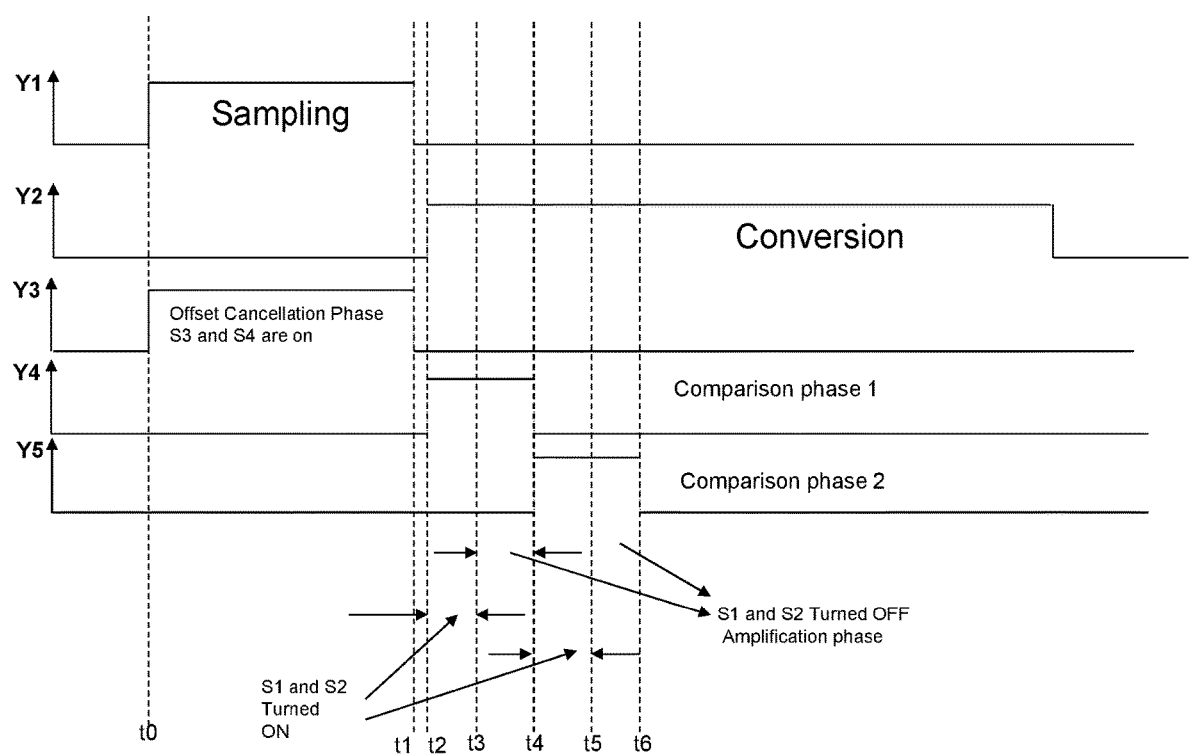
FIG. 6 illustrates a timing diagram of a method for controlling the preamplifier shown in FIG. 5 in accordance with various embodiments of the present disclosure.

FIG. 6 illustrates a timing diagram of a method for controlling the preamplifier shown in FIG. 5 in accordance with various embodiments of the present disclosure. The horizontal axis of FIG. 6 represents intervals of time. There are five vertical axes. The first vertical axis Y1 represents the sampling phase of an A/D converter. The second vertical axis Y2 represents a conversion phase of the A/D converter. The third vertical axis Y3 represents the status of the first auxiliary switch (S3) and the second auxiliary switch (S4). The fourth vertical axis Y4 represents the status of the first reset switch (S1) and the second reset switch (S2) during a first comparison phase. The fifth vertical axis Y5 represents the status of the first reset switch (S1) and the second reset switch (S2) during a second comparison phase.

Prior to the time instant t0, all reset switches and auxiliary switches are turned off. From t0 to t1, it is the sampling phase of the A/D converter. During the sampling phase, the inputs of the preamplifier are coupled together. The auxiliary switches S3 and S4 are turned on. The reset switches S1 and S2 are turned off. The offset voltages generated at the outputs of the preamplifier are stored at the first capacitor C1 and the second capacitor C2 respectively. After the offset voltages have been stored, the A/D converter enters into the conversion phase after a predetermined delay (the time period from t1 to t2). As shown in FIG. 6, during the conversion phase, the auxiliary switches S3 and S4 are turned off.

At t2, the preamplifier is configured to operate in a first comparison phase. The first comparison phase may correspond to a first comparison of the successive approximation process of the A/D converter. The first comparison phase is divided into two operating phases, namely a reset phase and an amplification phase. The reset phase is from t2 to t3. In the reset phase, the reset switches S1 and S2 may place the comparator in a reset state. In some embodiments, at the onset of each conversion phase, the comparator remains in the reset state. In this reset state, the capacitive D/A conversion network in the successive approximation A/D converter settles to a value according to the control signals of the A/D converter. After the capacitive D/A conversion network settles to the value, the comparator comes out of the reset phase. This ensures that the comparator gets the correct input value for amplification. The reset phase timing, including the delay depends on the settling of the capacitive D/A conversion network. The amplification phase is from t3 to t4. During the amplification phase, the reset switches S1 and S2 are turned off. The preamplifier is configured to amplify the input signal.

At t4, the preamplifier is configured to operate in a second comparison phase. The second comparison phase may correspond to a second comparison of the successive approximation process of the A/D converter. Similar to that of the first comparison phase, the second conversion phase includes a reset phase (from t4 to t5) and an amplification phase (from t5 to t6).

It should be recognized that while FIG. 6 illustrates the conversion phase of the A/D converter with two comparison phases, the conversion phase of the A/D converter could include any number of comparison phases.

Figure 7:
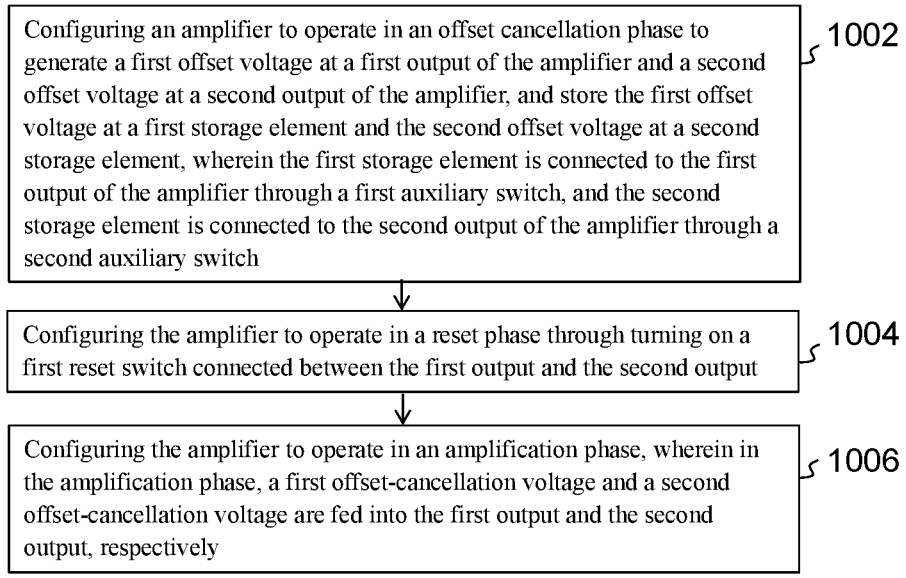
FIG. 7 illustrates a flow chart of a method for controlling the preamplifier shown in FIG. 5 in accordance with various embodiments of the present disclosure.

FIG. 7 illustrates a flow chart of a method for controlling the preamplifier shown in FIG. 5 in accordance with various embodiments of the present disclosure. This flowchart shown in FIG. 7 is merely an example, which should not unduly limit the scope of the claims. One of ordinary skill in the art would recognize many variations, alternatives, and modifications. For example, various steps illustrated in FIG. 7 may be added, removed, replaced, rearranged and repeated.

An amplifier comprises an offset cancellation stage. The amplifier is a preamplifier of a comparator in an A/D converter. The preamplifier may be configured to operate in various operating phases including an offset cancellation phase, a reset phase and an amplification phase.

At step 1002, the preamplifier is configured to operate in the offset cancellation phase to generate a first offset voltage at a first output of the amplifier and a second offset voltage at a second output of the amplifier. The first offset voltage is stored at a first storage element of the offset cancellation stage. The second offset voltage is stored at a second storage element of the offset cancellation stage. The first storage element is coupled to the first output of the amplifier through a first auxiliary switch. The second storage element is coupled to the second output of the amplifier through a second auxiliary switch.

At step 1004, the amplifier is configured to operate in a reset phase through turning on a first reset switch coupled between the first output and the second output of the amplifier. Furthermore, during the reset phase, a second reset switch is turned on. The second reset switch is coupled between two intermediate inputs of the amplifier.

At step 1006, the amplifier is configured to operate in an amplification phase. In the amplification phase, the first reset switch, the second reset switch, the first auxiliary switch and the second auxiliary switch are turned off. A first offset-cancellation voltage and a second offset-cancellation voltage are fed into the first output and the second output of the amplifier, respectively.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An amplifier comprising:
   a load pair including a first transistor and a second transistor;
   a common mode feedback circuit comprising a first common mode feedback transistor and a second common mode feedback transistor, wherein:
      a drain of the first common mode feedback transistor is coupled to a source of the first transistor, and a gate of the first common mode feedback transistor is coupled to a drain of the first transistor; and
      a drain of the second common mode feedback transistor is coupled to a source of the second transistor, and a gate of the second common mode feedback transistor is coupled to a drain of the second transistor; and
   a cross-coupled transistor pair configured to boost a gain of the amplifier, wherein the cross-coupled transistor pair is connected between a gate of the first transistor and a gate of the second transistor.

2. The amplifier of claim 1, wherein the cross-coupled transistor pair comprises a first negative resistance load coupled to the gate of the first transistor and a second negative resistance load coupled to the gate of the second transistor, and wherein the cross-coupled transistor pair comprises a first auxiliary transistor and a second auxiliary transistor, and wherein:
   the first auxiliary transistor of the cross-coupled transistor pair has a gate coupled to the gate of the second transistor, and a drain coupled to the gate of the first transistor; and
   the second auxiliary transistor of the cross-coupled transistor pair has a gate coupled to the gate of the first transistor, and a drain coupled to the gate of the second transistor.

3. The amplifier of claim 2, further comprising:
   a first diode-connected load coupled between the gate of the first transistor and a source of the first common mode feedback transistor; and
   a second diode-connected load coupled between the gate of the second transistor and a source of the second common mode feedback transistor.

4. The amplifier of claim 3, wherein:
   the first diode-connected load and the first auxiliary transistor of the cross-coupled transistor pair are coupled in parallel; and
   the second diode-connected load and the second auxiliary transistor of the cross-coupled transistor pair are coupled in parallel.

5. The amplifier of claim 1, further comprising:
   a first input stage comprises a first input transistor and a second input transistor, and wherein:
      a gate of the first input transistor is configured to receive a first input signal;
      a gate of the second input transistor is configured to receive a second input signal; and
      a source of the first input transistor is coupled to a source of the second input transistor; and
   a second input stage comprises a third input transistor and a fourth input transistor, wherein:
      a gate of the third input transistor is configured to receive the second input signal;
      a gate of the fourth input transistor is configured to receive the first input signal; and
      a source of the third input transistor is coupled to a source of the fourth input transistor.

6. The amplifier of claim 5, further comprising:
   a first cascode transistor stage comprising a first cascode transistor and a second cascode transistor, wherein:
      a gate of the first cascode transistor and a gate of the second cascode transistor are coupled to a bias voltage;
      a source of the first cascode transistor is coupled to a drain of the first input transistor;
      a source of the second cascode transistor is coupled to a drain of the second input transistor;
      a drain of the first cascode transistor is coupled to the drain of the first transistor; and a drain of the second cascode transistor is coupled to a gate of the first transistor; and a second cascode transistor stage comprising a third cascode transistor and a fourth cascode transistor, wherein:
a gate of the third cascode transistor and a gate of the fourth cascode transistor are coupled to the bias voltage;
a source of the third cascode transistor is coupled to a drain of the third input transistor;
a source of the fourth cascode transistor is coupled to a drain of the fourth input transistor;
a drain of the third cascode transistor is coupled to the drain of the second transistor; and
a drain of the fourth cascode transistor is coupled to a gate of the second transistor.

7. The amplifier of claim 1, wherein:
the drain of the first transistor is configured to generate a first output signal of the amplifier; and
the drain of the second transistor is configured to generate a second output signal of the amplifier.

8. The amplifier of claim 1, wherein:
the drain of the first common mode feedback transistor is directly coupled to the drain of the second common mode feedback transistor.

9. A method comprising:
configuring an amplifier to operate in an offset cancellation phase to generate a first offset voltage at a first output of the amplifier and a second offset voltage at a second output of the amplifier, and store the first offset voltage and the second offset voltage at a first storage element and a second storage element respectively, wherein the first storage element is coupled to the first output of the amplifier through a first auxiliary switch, and the second storage element is coupled to the second output of the amplifier through a second auxiliary switch;
configuring the amplifier to operate in a reset phase through turning on a first reset switch coupled between the first output and the second output of the amplifier; and
configuring the amplifier to operate in an amplification phase, wherein in the amplification phase, a first offset-cancellation voltage and a second offset-cancellation voltage are fed into the first output and the second output of the amplifier, respectively.

10. The method of claim 9, further comprising:
an auxiliary amplifier having a first input coupled to the first storage element, a second input coupled to the second storage element, a first output configured to generate the first offset-cancellation voltage and a second output configured to generate the second offset-cancellation voltage, wherein:
the first output of the auxiliary amplifier is coupled to the first output of the amplifier;
the second output of the auxiliary amplifier is coupled to the second output of the amplifier; and
the auxiliary amplifier comprises a differential pair.

11. The method of claim 10, wherein:
the first auxiliary switch is coupled between the first input and the first output of the auxiliary amplifier; and
the second auxiliary switch is coupled between the second input and the second output of the auxiliary amplifier.

12. The method of claim 9, further comprising:
during the reset phase, turning on a second reset switch coupled between a first intermediate input and a second intermediate input of the amplifier, wherein:
the first intermediate input is at a gate of a first transistor of a load pair of the amplifier;
the first output of the amplifier is at a drain of the first transistor of the load pair of the amplifier;
the second intermediate input is at a gate of a second transistor of the load pair of the amplifier;
the second output of the amplifier is at a drain of the second transistor of the load pair of the amplifier; and
a source of the first transistor of the load pair is directly coupled to a source of the second transistor of the load pair.

13. The method of claim 12, wherein the amplifier comprises:
a common mode feedback circuit comprising a first common mode feedback transistor and a second common mode feedback transistor, wherein:
a drain of the first common mode feedback transistor is coupled to the source of the first transistor, and a gate of the first common mode feedback transistor is coupled to the drain of the first transistor; and
a drain of the second common mode feedback transistor is coupled to the source of the second transistor, and a gate of the second common mode feedback transistor is coupled to the drain of the second transistor;
a first negative resistance load coupled to a gate of the first transistor; and
a second negative resistance load coupled to a gate of the second transistor.

14. The method of claim 13, further comprising:
a first diode-connected load coupled between the gate of the first transistor and a source of the first common mode feedback transistor, wherein the first diode-connected load and the first negative resistance load are coupled in parallel;
a second diode-connected load coupled between the gate of the second transistor and a source of the second common mode feedback transistor, wherein the second diode-connected load and the second negative resistance load are coupled in parallel;
a first cascode transistor stage comprising a first cascode transistor coupled to a first input transistor, and a second cascode transistor coupled to a second input transistor, wherein:
a gate of the first cascode transistor and a gate of the second cascode transistor are coupled to a bias voltage;
a drain of the first cascode transistor is coupled to the drain of the first transistor; and
a drain of the second cascode transistor is coupled to the gate of the first transistor; and
a second cascode transistor stage comprising a third cascode transistor coupled to a third input transistor, and a fourth cascode transistor coupled to a fourth input transistor, wherein:
a gate of the third cascode transistor and a gate of the fourth cascode transistor are coupled to the bias voltage;
a drain of the third cascode transistor is coupled to the drain of the second transistor; and
a drain of the fourth cascode transistor is coupled to the gate of the second transistor.

15. The method of claim 9, wherein:
the first storage element is a first capacitor; and
the second storage element is a second capacitor.

16. An apparatus comprising:
a load pair including a first transistor and a second transistor;
a common mode feedback circuit comprising a first common mode feedback transistor and a second common mode feedback transistor, wherein:
   a drain of the first common mode feedback transistor is coupled to a source of the first transistor, and a gate of the first common mode feedback transistor is coupled to a drain of the first transistor; and
   a drain of the second common mode feedback transistor is coupled to a source of the second transistor, and a gate of the second common mode feedback transistor is coupled to a drain of the second transistor; and
an offset cancellation stage coupled to outputs of the load pair.

17. The apparatus of claim 16, further comprising:
a first auxiliary switch coupled between a drain of the first transistor and a first capacitor of the offset cancellation stage, wherein the first auxiliary switch is configured to be turned on in response to a first operating phase, and turned off in response to a second operating phase; and
a second auxiliary switch coupled between a drain of the second transistor and a second capacitor of the offset cancellation stage, wherein the second auxiliary switch is configured to be turned on in response to the first operating phase, and turned off in response to the second operating phase.

18. The apparatus of claim 17, wherein:
the apparatus is a preamplifier of a comparator;
the first operating phase is an offset cancellation phase of the preamplifier;
the second operating phase is an amplification phase of the preamplifier; and
the offset cancellation stage is an auxiliary amplifier having a first input coupled to the first capacitor and a second input coupled to the second capacitor.

19. The apparatus of claim 18, further comprising:
a first reset switch coupled between the drain of the first transistor and the drain of the second transistor, wherein the first reset switch is configured to be turned on when the preamplifier is configured to operate in a reset phase, and the first reset switch is configured to be turned off when the preamplifier is configured to operate in the amplification phase; and
a second reset switch coupled between a gate of the first transistor and a gate of the second transistor, wherein the second reset switch is configured to be turned on when the preamplifier is configured to operate in the reset phase, and the second reset switch is configured to be turned off when the preamplifier is configured to operate in the amplification phase.

20. The apparatus of claim 16, further comprising:
a first diode-connected load coupled between a gate of the first transistor and a source of the first common mode feedback transistor;
a second diode-connected load coupled between a gate of the second transistor and a source of the second common mode feedback transistor;
a first negative resistance load coupled to the gate of the first transistor, wherein the first negative resistance load is coupled in parallel with the first diode-connected load; and
a second negative resistance load coupled to the gate of the second transistor, wherein the second negative resistance load is coupled in parallel with the second diode-connected load, and wherein the first negative resistance load and the second negative resistance load are formed by a cross-coupled transistor pair.

* * * * *